(12) United States Patent
Lamola et al.

(10) Patent No.: US 7,041,331 B2
(45) Date of Patent: May 9, 2006

(54) ELECTRONIC DEVICE MANUFACTURE

(75) Inventors: Angelo A. Lamola, Vallejo, CA (US); Nathaniel E. Brese, Farmingdale, NY (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 153 days.

(21) Appl. No.: 10/816,628

(22) Filed: Apr. 2, 2004

(65) Prior Publication Data

US 2004/0262751 A1 Dec. 30, 2004

Related U.S. Application Data

(60) Provisional application No. 60/460,667, filed on Apr. 5, 2003.

(51) Int. Cl.
*C23C 26/00* (2006.01)

(52) U.S. Cl. .................... 427/96.1; 427/96.5; 428/448; 428/500; 428/521; 528/37; 585/361

(58) Field of Classification Search .................... None
See application file for complete search history.

(56) References Cited

U.S. PATENT DOCUMENTS

| | | | |
|---|---|---|---|
| 4,999,699 A | 3/1991 | Christie et al. | |
| 5,386,624 A | 2/1995 | George et al. | |
| 5,641,856 A | 6/1997 | Meurs | |
| 5,726,391 A | 3/1998 | Iyer et al. | |
| 5,760,337 A | 6/1998 | Iyer et al. | |
| 5,840,215 A | 11/1998 | Iyer et al. | |
| 5,912,282 A | 6/1999 | Iyer et al. | |
| 5,973,052 A | 10/1999 | Iyer et al. | |
| 5,985,043 A | 11/1999 | Zhou et al. | |
| 5,985,456 A | 11/1999 | Zhou et al. | |
| 6,180,187 B1 | 1/2001 | Ma et al. | |
| 6,197,122 B1 | 3/2001 | Ober et al. | |
| 6,225,704 B1 | 5/2001 | Sumita et al. | |
| 6,261,871 B1 | 7/2001 | Langari et al. | |
| 6,271,335 B1 * | 8/2001 | Small et al. | 528/170 |
| 6,274,650 B1 | 8/2001 | Cui | |
| 6,337,384 B1 * | 1/2002 | Loy et al. | 528/393 |
| 6,825,315 B1 * | 11/2004 | Aubert | 528/393 |
| 2002/0032280 A1 | 3/2002 | Charles et al. | |
| 2002/0035201 A1 | 3/2002 | Wang et al. | |
| 2004/0014933 A1 * | 1/2004 | Wudl et al. | 528/365 |
| 2004/0261904 A1 * | 12/2004 | Chen et al. | 148/23 |

FOREIGN PATENT DOCUMENTS

| WO | WO 94/02536 | 2/1994 |
|---|---|---|
| WO | WO 98/27160 | 6/1998 |
| WO | WO 00/34032 | 6/2000 |

OTHER PUBLICATIONS

"Removable Foams Based on an Epoxy Resin Incorporating Reversible Diels-Alder Adducts", Aubert et al., J. Appl. Polym. Sci (2002), pp. 1496.*

* cited by examiner

*Primary Examiner*—Marc Zimmer
(74) *Attorney, Agent, or Firm*—S. Matthew Cairns

(57) ABSTRACT

Compositions suitable for use as underfill materials in an integrated circuit assembly are provided. Also provided are methods of preparing integrated circuit assemblies containing certain underfill materials as well as electronic devices containing such integrated circuit assemblies.

6 Claims, 1 Drawing Sheet

ELECTRONIC DEVICE MANUFACTURE

This application claims benefit of 60/460,667, filed Apr. 5, 2003.

BACKGROUND OF THE INVENTION

The present invention relates generally to the field of interconnection structures for joining an integrated circuit to a carrier substrate. In particular, the present invention is related to films for adhering and underfilling soldered integrated circuits to a substrate and methods for doing the same.

Integrated circuit assemblies are utilized in virtually every electronic device. Such assemblies include an integrated circuit ("IC") and a carrier substrate. Each integrated circuit contains input/output points ("I/Os"), or leads, on its surface. These I/Os are connected to the circuit pattern on the carrier substrate at specific points on the substrate called "lands" or "pads." So-called "flip-chip" processes are conventionally used for mounting ICs to the carrier substrates.

In a flip-chip process, solder bumps or balls are placed on the I/Os of the integrated circuit. The IC is then inverted and placed directly on the circuitized side of the carrier substrate such that the solder bumps align with the lands on the carrier substrate. Heat is then applied to reflow the solder which forms the solder joint. In the final assembly, a gap remains between the carrier substrate and the IC. Such gap is due to the height of the solder joints.

Although such flip-chip processes offer advantages in the manufacture of electronic devices, such as freeing up enormous space on the carrier substrate and greatly simplifying the manufacture of IC assemblies, such process also has a significant disadvantage. The solder joints in a flip-chip assembly are susceptible to thermal stress and failure. The coefficients of thermal expansion ("CTE") for the integrated circuit, carrier substrate and the solder joint are all different. Accordingly, these materials swell and contract at substantially different rates as the temperature rises or falls. This subjects the solder joint to tremendous stress, which causes the joints to fail over time.

One approach to solving the CTE stress problem is by filling the gap between the IC and the carrier substrate, such as with a low viscosity polymer composition. Such a process is referred to as "underfilling." A low viscosity polymer composition is one having a viscosity of 1000 poise or less at room temperature, and 100 poise or less at an application temperature of typically 45° C. or greater. In a conventional underfilling process, the low viscosity polymer composition is dispensed onto two sides of the soldered IC and wicked (i.e. by capillary action) into the gap between the IC and the carrier substrate. The assembly may be heated to increase the rate of flow of the polymer composition into the gap. Once the flow is completed, the underfill composition is applied to the remaining two sides of the IC and the process repeated. The underfill is then typically cured by heating. Underfill materials also provide additional support for the IC and increase the thermal contact between the IC and the carrier substrate.

Conventional underfill materials, which include epoxies and polyimides, have certain disadvantages. For example, certain compositions use anhydride hardening agents which have a tendency to hydrolyze to diacids when subjected to environmental moisture. Such hydrolysis reduces performance. Relatively large thermal expansion differentials still exist in flip-chip assemblies using conventional underfills. This is due to the fact that the cured underfill materials have high CTEs relative to the solder joint.

Periodically, it is necessary to remove the IC from an IC assembly, such as when an IC does not pass inspection. In such cases, underfills that can be re-molded or re-worked are desirable as they facilitate disassembly of the structure. For example, U.S. Pat. No. 6,271,335 (Small et al.) discloses thermally removable encapsulants containing at least one bis(maleimide) compound and a tris- or tetra-furan compound. While such highly cross-linked systems may have superior physical properties, they are often irreversibly damaged (i.e. cracked) by high stresses. Such high stresses arise during continued use of the electronic device containing the IC assembly. It is desirable to have an underfill material that not only solves the aforementioned problems, but is also self-healing. By "self-healing" it is meant that minor defects, such as cracks, in the underfill material are repaired by the material itself. In order to be self-healing, the underfill material needs an amount of flexibility within the polymer and monomers composing the polymer and an amount of reactivity that will allow the underfill material to re-polymerize during use to repair certain defects, such as cracks.

A further problem with conventional underfill materials is that volume changes occur during curing, differential thermal expansion and compositional inhomogeneity can lead to poor interfacial contact, reduction in thermal conductivity and other problems. Underfill materials are therefore desired that do not substantially change volume during curing.

SUMMARY OF THE INVENTION

The present invention provides a re-moldable polymeric resin suitable for use in an integrated circuit assembly including as polymerized units one or more dienophiles and one or more dienes, wherein at least one diene contains at least a pair of conjugated double bonds capable of undergoing a Diels-Alder reaction and having at least one hydrogen on the first and fourth carbons of the conjugated double bonds.

Also provided by the present invention is a method of preparing an encapsulated integrated circuit assembly including the steps of: a) providing an integrated circuit assembly including an integrated circuit attached to a carrier substrate by a plurality of metallic connections, the metallic connections extending from the carrier substrate to the integrated circuit to form a gap between the carrier substrate and the integrated circuit; b) filling the gap with an underfill composition including a binder selected from the group consisting of a Diels-Alder reaction polymer and a polycyclosiloxane, wherein the Diels-Alder reaction polymer includes as polymerized units one or more dienophiles and one or more dienes, wherein at least one diene contains at least a pair of conjugated double bonds capable of undergoing a Diels-Alder reaction and having at least one hydrogen on the first and fourth carbons of the conjugated double bonds. Such metallic connections typically include solder and may be solder balls or bumps or metallic posts, such as copper, containing a solder tip.

Still further provided by the present invention is an electronic device including an encapsulated integrated circuit assembly including an integrated circuit assembly including an integrated circuit attached to a carrier substrate by a plurality of metallic connections, the metallic connections extending from the carrier substrate to the integrated circuit to form a gap between the carrier substrate and the integrated circuit; and an underfill material in the gap, wherein the underfill material is composed of a binder selected from the group consisting of a Diels-Alder reaction polymer and a polycyclosiloxane, wherein the Diels-Alder reaction polymer includes as polymerized units one or more dienophiles and one or more dienes, wherein at least one diene contains at least a pair of conjugated double bonds capable of undergoing a Diels-Alder reaction and having at least one hydrogen on the first and fourth carbons of the conjugated double bonds.

DETAILED DESCRIPTION OF THE INVENTION

Figure 1:
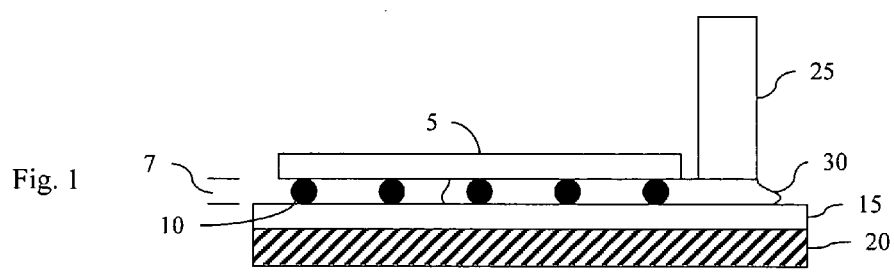
FIG. 1 illustrates a first process of the invention where the underfill material is disposed under the integrated circuit by flowing.

As used throughout this specification, the following abbreviations shall have the following meanings, unless the context clearly indicates otherwise: ° C.=degrees centigrade; g=gram; mol=moles; L=liter; ca.=approximately; μm=micron=micrometer; wt %=percent by weight; mL=milliliter; and μL=microliter.

"Halogen" refers to fluorine, chlorine, bromine and iodine and "halo" refers to fluoro, chloro, bromo and iodo. Likewise, "halogenated" refers to fluorinated, chlorinated, brominated and iodinated. "Alkyl" includes linear, branched and cyclic alkyl. Likewise, "alkenyl" includes linear, branched and cyclic alkenyl. "(Meth)acrylate" includes both acrylate and methacrylate. The term "diene" refers to a compound containing a moiety having two or more conjugated double bonds capable of undergoing a Diels-Alder reaction. "Diene" includes trienes and moieties having 4 or more double bonds where two of the double bonds are conjugated and are capable of undergoing a Diels-Alder reaction. "Dienophile" refers to a compound containing a moiety having at least one carbon-carbon double bond capable of undergoing a Diels-Alder reaction. "Monomer" refers to any compound capable of being polymerized and includes both dieneophiles and dienes. Throughout this specification, the terms "underfill" and "encapsulant" are used interchangeably, and include "glob-tops". The term "underfill" does not include injection molded encapsulants or other hard plastic encapsulants. The articles "a" and "an" refer to the singular and the plural.

Unless otherwise noted, all amounts are percent by weight and all ratios are molar ratios. All numerical ranges are inclusive and combinable in any order except where it is clear that such numerical ranges are constrained to add up to 100%.

The present re-moldable polymeric resin includes as polymerized units one or more dienophiles and one or more dienes, wherein at least one diene contains at least a pair of conjugated double bonds capable of undergoing a Diels-Alder reaction and having at least one hydrogen on the first and fourth carbons of the conjugated double bonds. In another embodiment, the present re-moldable polymeric resin includes as polymerized units one or more dienophiles and one or more dienes, wherein at least one diene contains one or more hydrogens bonded to each of the olefinic carbons of the diene moiety capable of undergoing a Diels-Alder reaction. Such resins are suitable for use in an integrated circuit assembly, particularly as underfill in such assembly. A wide variety of dieneophiles and dienes may be used to prepare the present re-moldable resins.

Dienes capable of undergoing a Diels-Alder reaction contain at least two conjugated double bonds, and may contain a number of pairs of conjugated double bonds. Suitable dienes for use in the present invention are those that have at least one hydrogen on the first and fourth olefinic carbons of the conjugated double bonds that undergo or participate in the Diels-Alder reaction. The carbons in such dienes are numbered starting at one end of the conjugated pair of double bonds and numbering consecutively through both double bonds, as is illustrated in the suitable dienes of formula (I):

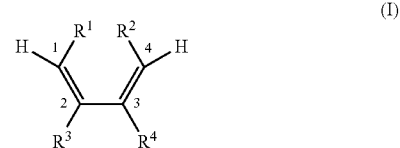

where $R^1$, $R^2$, $R^3$ and $R^4$ are independently selected from hydrogen, alkyl, alkenyl, aryl, heteroatoms, substituted heteroatoms, and the like. $R^1$ and $R^2$ or $R^3$ and $R^4$ may be taken together to form a cyclodiene. Typically, $R^1$, $R^2$, $R^3$ and $R^4$ are independently selected from hydrogen, $(C_1-C_{20})$alkyl, $(C_2-C_{20})$alkenyl, $(C_6-C_{12})$aryl, or Y, and more typically $(C_1-C_2)$alkyl, $C_2-C_{12})$alkenyl, $(C_6-C_{10})$aryl or Y. Y is $OR^5$, $NR^6R^7$, CN, CHO, $CO_2R^1$, $C(O)R^1$, $C(O)NR^6R^7$, and the like. $R^5$ is $(C_1-C_{12})$alkyl, $C_2-C_{12})$alkenyl or $(C_6-C_{10})$aryl. $R^6$ and $R^7$ are independently selected from H, $(C_1-C_{12})$alkyl, $C_2-C_{12})$alkenyl and $(C_6-C_{10})$aryl. When $R^1$ and $R^2$ are taken together to form a cyclodiene, such cyclodiene may be alicyclic or heterocyclic. Any of the above described alkyl, alkenyl and aryl groups may optionally be substituted. By "substituted" it is meant that one or more hydrogens on the alkyl, alkenyl or aryl groups are replaced by one or more substituents, such as hydroxy, cyano, $(C_1-C_6)$alkoxy, amino, $(C_1-C_6)$alkylamino, di$(C_1-C_6)$alkylamino, phenyl, $(C_1-C_6)$alkylaryl, halo, oxo (=O), imino (=$NR^6$), keto (—C(=O) $R^1$), epoxides, and the like.

Suitable dienes include, without limitation: butadiene; isoprene; 2-vinyl-1,3-butadiene; 1,3-hexadiene; 2,4-hexadiene; 1,3-pentadiene; furan; pyran; thiophene; cyclopentadiene; bis-cyclopentadienes; tri-cyclopentadienes; cyclohexadiene; cycloheptadiene; cyclooctadiene and cyclooctatriene. Other multifunctional dienes may also be used. The term "multifunctional dienes" refers to compounds having 2 or more diene moieties capable of undergoing a Diels-Alder reaction. Exemplary multifunctional dienes include the bis-cyclopentadienes, such as those of formula II:

where Z is a flexible moiety such as, but not limited to, alkyl, alkenyl, aryl, arylene ether, alkylaryl, (meth)acrylic moiety, epoxy moiety, and siloxane moiety. Z may also include a mixture of any of the foregoing moieties. The flexible moiety may further include one or more diene moieties.

Particularly suitable flexible moieties include poly(alkylene oxides) such as poly(ethylene oxide) and poly(propylene oxide), poly(arylene ethers), poly(arylene esters), and polysiloxanes such as those having the general formula (—O—SiR'$_2$)$_n$ where n=1–100 and more typically n=10–70.

The dienes are generally commercially available or can be prepared by methods known in the literature. Such dienes can be purified or used without further purification.

Any suitable dieneophile may be used in the present invention. Such dienophiles may be linear or cyclic. Typically, the dienophiles contain one or more carbon-carbon double bonds capable of undergoing a Diels-Alder reaction. More typically, the dienophiles have one or more Diels-Alder participating double bonds where at least 2 of the 4 substituents on the olefinic carbons are hydrogen. The hydrogens may both be on the same olefinic carbon, or each olefinic carbon may have one hydrogen. Suitable dienophiles may be represented by the formula: $R^8R^9C=CR^{10}R^{11}$, where $R^8$ is (C$_1$–C$_{20}$)alkyl, (C$_2$–C$_{20}$) alkenyl, (C$_6$–C$_{12}$)aryl, or A; $R^9$, $R^{10}$ and $R^{11}$ are independently selected from H or (C$_1$–C$_{20}$)alkyl, (C$_2$–C$_{20}$)alkenyl, (C$_6$–C$_{12}$)aryl, or A; where A is an electron withdrawing group such as halogen, cyano, CO$_2$R$^8$, CO$_2$H, C(O)NH$_2$, C(O)NR$^8_2$; provided that at least two of $R^9$, $R^{10}$ and $R^{11}$ are hydrogen.

Suitable dienophiles include, without limitation: vinylpyridines such as 2-vinylpyridine or 4-vinylpyridine; lower alkyl (C$_1$–C$_8$) substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, orp-aminostyrene; maleimide; N-alkylmaleimides; N-vinyl-oxazolidone; N,N-dimethyl aminoethyl-vinyl-ether; ethyl-2-cyano acrylate; vinyl acetonitrile; N-vinylphthalimide; N-vinylpyrrolidones such as N-vinyl-thio-pyrrolidone, 3-methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; vinyl piperidines; styrene; α-methylstyrene; vinyltoluene; p-methylstyrene; ethylvinylbenzene; vinylnaphthalene; vinylxylene; (meth)acrylic acid; acolein; (meth)acrylamide; (meth)acrylonitrile; maleic anhydride; epoxybutene; allylglycidyl ether; norbomene; 2,5-dihydrofuran; cyclohexane; cyclopentane; alkenes, i.e. compounds having the formula C$_n$H$_{2n}$; vinyl acetate; vinyl formamide; vinyl chloride; vinyl fluoride; vinyl bromide; vinylidene chloride; vinylidene fluoride; and vinylidene bromide.

In one embodiment, the dieneophile is a multifunctional monomer, i.e. it contains more than one carbon-carbon double bond capable of undergoing a Diels Alder reaction. Such multifunctional dienophiles may contain two, three, four or more such carbon-carbon double bonds. Exemplary multifunctional dienophiles include, but are not limited to: poly-maleimides; divinylbenzene; non-conjugated alkapolyenes such as alkadienes and alkatrienes; bis(triazolidinediones); bis(phthalazinediones); quinones; bis(tricyanoethylenes), maleate or fumarate polyesters; vinyl (meth)acrylate; allyl (meth)acrylate; trivinylbenzene; divinyltoluene; divinylpyridine; divinylnaphthalene; divinylxylene; ethyleneglycol diacrylate; trimethylolpropane triacrylate; diethyleneglycol divinyl ether; trivinylcyclohexane; ethyleneglycol dimethacrylate; diethyleneglycol dimethacrylate; propyleneglycol dimethacrylate; propyleneglycol diacrylate; trimethylolpropane trimethacrylate; divinyl benzene; glycidyl methacrylate; 2,2-dimethylpropane-1,3-diacrylate; 1,3-butylene glycol diacrylate; 1,3-butylene glycol dimethacrylate; 1,4-butanediol diacrylate; diethylene glycol diacrylate; diethylene glycol dimethacrylate; 1,6-hexanediol diacrylate; 1,6-hexanediol dimethacrylate; tripropylene glycol diacrylate; triethylene glycol dimethacrylate; tetraethylene glycol diacrylate; polyethylene glycol 200 diacrylate; tetraethylene glycol dimethacrylate; polyethylene glycol dimethacrylate; ethoxylated bisphenol A diacrylate; ethoxylated bisphenol A dimethacrylate; polyethylene glycol 600 dimethacrylate; poly(butanediol)diacrylate; pentaerythritol triacrylate; trimethylolpropane triethoxy triacrylate; glyceryl propoxy triacrylate; pentaerythritol tetraacrylate; pentaerythritol tetramethacrylate; dipentaerythritol monohydroxypentaacrylate; divinylsilane; trivinylsilane; dimethyldivinylsilane; divinylmethylsilane; methyltrivinylsilane; diphenyldivinylsilane; divinylphenylsilane; trivinylphenylsilane; divinylmethylphenylsilane; tetravinylsilane; dimethylvinyldisiloxane; poly(methylvinylsiloxane); poly(vinylhydrosiloxane); poly(phenylvinylsiloxane); tetraallylsilane; 1,3-dimethyl tetravinyldisiloxane; and 1,3-divinyl tetramethyldisiloxane.

Particularly useful poly-maleimides are those of formulae III and IV:

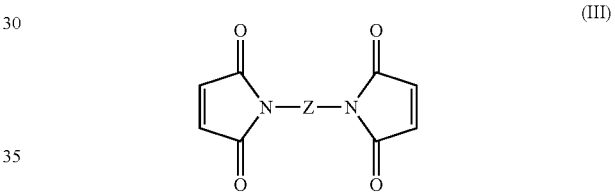

(III)

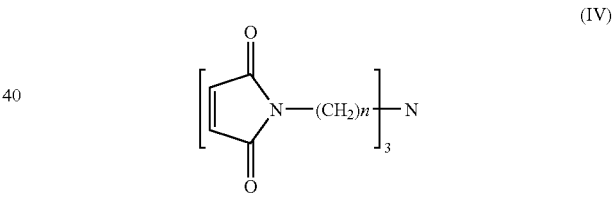

(IV)

where Z is as defined above and n=1 to 20. Particularly useful poly-maleimides are those of formula V and VI:

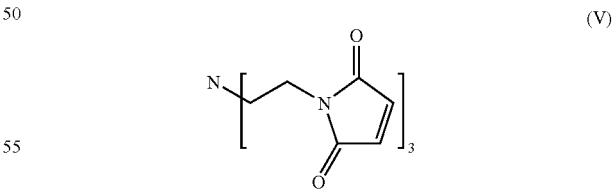

(V)

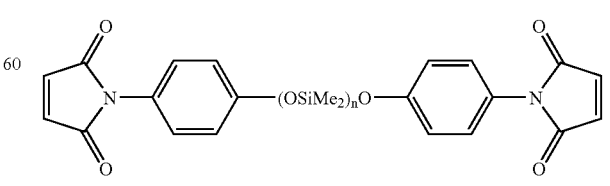

(VI)

where n=1 to 100.

The dienophiles are well known in the art and can be purchased commercially or can be prepared by methods known in the literature. For example, bis-maleimides can be prepared according to the procedures disclosed in McElhanon et al., *Journal of Applied Polymer Science*, 85 (2002), pp 1496–1502. Such dienophiles can be purified or used without further purification.

A mixture of dienes may be used in the present invention. Likewise, a mixture of dienophiles may be used in the present invention. Typically, multifunctional dienes are preferred. Also preferred are multifunctional dienophiles. More typically, both multifunctional dienes and multifunctional dienophiles are used. The use of both multifunctional dienes and multifunctional dienophiles allows for greater network interpenetration as compared to the use of dienes or dienophiles that are not multifunctional.

In general, the present re-moldable resins are prepared by the Diels-Alder polymerization of one or more dienes with one or more dienophiles, wherein at least one diene contains at least a pair of conjugated double bonds capable of undergoing a Diels-Alder reaction and having at least one hydrogen on the first and fourth carbons of the conjugated double bonds. The ratio of diene moiety to dienophiles moiety is typically 1:1, but may range from 0.75:1 to 1:0.75. Such reactions may be performed neat, i.e. without a solvent, or in the presence of a solvent. When such reactions are performed neat, at least one of the reactants is typically a liquid, or alternatively, the reactants are heated to a temperature sufficient to melt one or more of the reactants and the polymerization performed during such melt phase. A variety of solvents are suitable for the present Diels-Alder reactions. Exemplary solvents include, without limitation: alcohols such as methanol, ethanol, propanol, and butanol; amides such as N,N-dimethylacetamide and N,N-dimethylformamide ("DMF"); ethers such as tetrahydrofuran ("THF"); and dimethyl sulfoxide ("DMSO").

The one or more dienes and one or more dienophiles and optional solvent may be combined in any order to prepare an underfill composition. This composition may be used as is or may be pre-polymerized. The term "pre-polymerize" refers to a partial polymerization, which increases the molecular weight of the components in the composition and typically the viscosity of the composition. Such pre-polymerized composition may then be further polymerized. In general, the present Diels-Alder polymerizations may be performed at elevated temperatures (i.e. above room temperature), elevated pressures (i.e. above atmospheric pressure), or at both elevated temperature and pressure. Typically, the present Diels-Alder polymerizations are performed at a temperature in the range of 60° to 250° C., and more typically from 75° to 225° C. The particular reaction conditions will depend upon the particular diene and dienophiles selected.

Also suitable for use as underfill material are polycyclosiloxanes. Particularly suitable polycyclosiloxanes are those of formula VII:

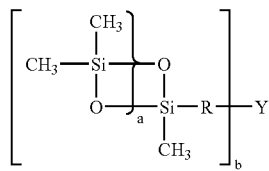

wherein a=1–20; b=the valence of Y; R is O, ($C_1$–$C_{12}$) alkylene, ($C_1$–$C_3$)alkyleneoxy, arylene, and aryleneoxy; and Y is H, OH, $(SiE_c)_d$ and

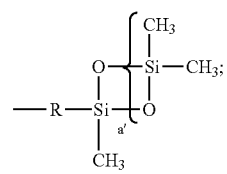

each E is independently R, H, O, OH, ($C_1$–$C_{12}$)alkyl, ($C_2$–$C_{12}$)alkenyl, aryl and ($C_1$–$C_2$)alkoxy; c=0–3; d=1–100; and a'=1–20. Typically, a=2–8. More typically, R is ($C_2$–$C_8$) alkylene. Typically, b=1–4. In a further embodiment, d=2–80. Such polycyclosiloxanes may be prepared by a variety of methods, such as those described in International Patent Application WO 94/02536 (Buese et al.).

In general, re-moldable siloxane rubbers for use as underfills are prepared by reacting a mixture of an acid catalyst having a pKa of less than 0, preferably ≦−3 and more preferably ≦−5 and typically −9, one or more polycyclosiloxanes containing one or more polyfunctional siloxane unit as described above, and one or more polysiloxanes selected from linear polydimethylsiloxane, polydimethylcyclosiloxane containing from 6 to 50 silicon-oxygen bonds, linear or cyclic block copolymer of polydimethylsiloxane and a non-siloxane organic polymer, and linear or cyclic random copolymer of a siloxane of the formula $Si(R^{12})(R^{13})O$ wherein $R^{12}$ and $R^{13}$ are different and are selected from hydrogen, ($C_1$–$C_{18}$)alkyl, ($C_2$–$C_{18}$)alkenyl, ($C_6$–$C_{10}$)aryl, and hydroxy($C_1$–$C_{18}$)alkyl. This reaction may be performed neat or in an organic solvent. Suitable polydimethylsiloxanes include, but are not limited to, those having the formula $CH_3(Si(CH_3)_2O)_nCH_3$ wherein n is from 1 to 100,000 or higher, and typically n is from 10 to 250. Exemplary polydimethylcyclosiloxanes include, without limitation, those having the formula $(—Si(CH_3)_2O—)_m$, wherein m is from 3 to 25, and typically m is from 4 to 12. The polysiloxane component may also be composed of a linear or cyclic block copolymer of a polydimethylsiloxane and a non-siloxane organic polymer, such as, for example, polyalkylenes, polyarylenes, polyesters, polyethers, polyamides, polyimides, polyurethanes, and polyureas. In such copolymers, the ratio of dimethylsiloxy monomer units ($—Si(CH_3)_2O—$) to non-dimethylsiloxy monomer units may range from 1:1 to 100,000:1.

Suitable acid catalysts include, without limitation, trifluoromethanesulfonic acid, nitrotrifluoromethylbenzenesulfonic acid, trifluoromethylbenzenesulfonic acid, pentafluorobenzenesulfonic acid, 2,2,2-trifluoroethanesulfonic acid, nitrobenzenesulfonic acid, dinitrobenzenesulfonic acid, fluorobenzenesulfonic acid, nitrofluorobenzenesulfonic acid, nitrotrifluoromethanesulfonic acid, and benzenedisulfonic acid. Typically, the acid catalyst is present in the reaction mixture in an amount of 0.05 to 0.5 wt %, based on the total weight of the reaction mixture. It will be appreciated that amounts of acid catalyst outside this range may also be used.

When the acid catalyst is added, the catalyst may be dispersed by a variety of means, such as shaking, or stirring. The reaction may be performed at atmospheric pressure, although higher or lower pressures may also be employed. The temperature of the reaction may vary across a wide range. Typically, the reaction temperature is ambient temperature, but may range from room temperature to 100° C. or higher.

Generally, the present polycyclosiloxane underfill compositions are prepared just prior to use or mixed and stored at reduced temperature until use. The polycyclosiloxane is first combined with any one or more polysiloxanes selected from linear polydimethylsiloxane, polydimethylcyclosiloxane containing from 6 to 50 silicon-oxygen bonds, linear or cyclic block copolymer of polydimethylsiloxane and a non-siloxane organic polymer, and linear or cyclic random copolymer of a siloxane of the formula $Si(R^{10})(R^{11})O$ wherein $R^{10}$ and $R^{11}$ are different and are selected from hydrogen, $(C_1-C_{18})$alkyl, $(C_2-C_{18})$alkenyl, $(C_6-C_{10})$aryl, and hydroxy$(C_1-C_{18})$alkyl. The polycyclosiloxane underfill composition is then combined with the acid catalyst. Next, the composition is applied to the IC assembly using any suitable method, such as those described below.

In another embodiment, the present underfill compositions may include one or more binders that include a Diels-Alder reaction product of one or more polycyclosiloxanes. Any suitable diene or dienophile may be reacted with a polycyclosiloxane containing one or more dienophile or diene moieties, respectively. Exemplary polycyclosiloxanes containing dienophile moieties include, without limitation, those containing vinyl groups, allyl groups, styryl groups and any other carbon-carbon double bond capable of undergoing a Diels-Alder reaction. Exemplary polycyclosiloxanes containing diene moieties include, but are not limited to, those containing cyclopentadienyl groups, butadiene groups, furan groups, and any other pair of conjugated carbon-carbon double bonds capable of undergoing a Diels-Alder reaction. Such Diels-Alder polycyclosiloxane reaction products are particularly useful in that they allow for the tailoring of various properties of the underfill materials, such as CTE.

The underfill compositions of the present invention may optionally contain one or more additives, such as flow aids, colorants, thixotropic agents, fillers, and the like. Fillers may be selected to provide a cured underfill with a desired CTE and thermal conductivity. Suitable fillers include, without limitation, $SiO_2$, $Al_2O_3$, BN, AlN, SiC, $ZrW_2O_8$, $ZrV_2O_7$, diamond and diamond-like materials. Such materials are well known in the art. Typically, a filler is used in the present underfill compositions. It is desired that a high volume of filler is used in the underfill composition as this reduces the CTE in final cured film. In general, the amount of filler in the underfill composition is any amount up to 90%. Filler is typically used in an amount of 10 to 90% by volume, more typically 20 to 80% by volume, and still more typically from 50 to 75% by volume. Suitable flow aids include surfactants. When used, surfactants are typically present in an amount of from 0.01 to 1 wt %, and more typically from 0.1 to 0.5 wt %. Such fillers are added to the underfill compositions prior to the step of applying the underfill material to an IC assembly.

Any suitable method may be used to apply the present underfill compositions to an IC assembly. Suitable methods include those utilizing capillary flow, no-flow techniques and wafer application techniques.

Underfill is most-commonly applied through the use of capillary forces. A die (or IC) with solder balls is aligned to a substrate which has landing pads already formed on it. The assembly is then sent through a "reflow oven" to melt the solder balls and connect the die to the substrate. After it is removed from the oven and cooled, a liquid underfill is dispensed through a dispensing needle (syringe or tube), and the material is pulled between the die and the substrate through capillary forces. The assembly is then placed into an oven, until the underfill material has cured. Such curing may also be achieved by the use of a hot plate, heat gun, heat lamp, and by any other suitable means. This curing stage may take minutes to hours, depending on the material and the curing conditions.

A schematic representation of a capillary flow underfill application is provided in FIG. 1. Referring to FIG. 1, die (or IC) 5 having solder balls (or bumps) 10 is applied to carrier substrate 15, thereby defining gap 7 between carrier substrate 15 and die 5. Carrier substrate 15 is disposed on heater 20 (e.g. at 80° to 90 C). Dispensing needle (or tube) 25 for dispensing underfill material 30 is adjacent gap 7. Underfill material 30 then flows into gap 7 by capillary flow.

No-flow underfills are typically applied to a carrier substrate (e.g. printed circuit board or package) as a liquid which is not fully cured. A die (or IC) with solder balls is then pressed onto the substrate, displacing the liquid underfill. The entire assembly is sent through an oven, where the solder reflows to form electrical contact with the substrate; simultaneously or in an additional step, the underfill cures to provide mechanical strength to the assembly.

Figure 2:
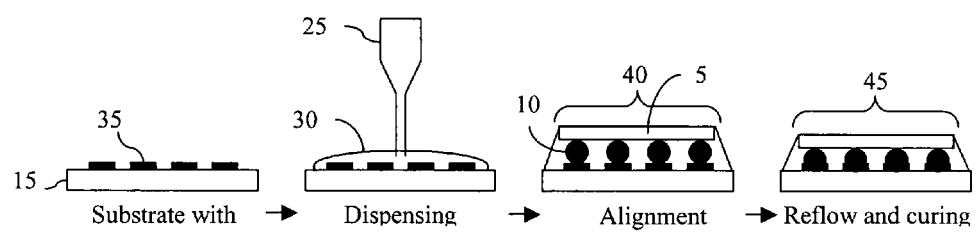
FIG. 2 illustrates a second process of the invention, where the underfill material is not flowed under the integrated circuit.

A schematic representation of a no-flow underfill process is provided in FIG. 2. Referring to FIG. 2, underfill material 30 is dispensed from dispensing needle 25 onto carrier substrate 15 having pads 35. A die 5 having solder balls 10 is then applied to carrier substrate 15 such that pads 35 and solder balls 10 are aligned, providing IC pre-assembly 40. The IC pre-assembly 40 is then heated to reflow the solder and cure underfill material 30 to provide finished IC assembly 45.

Wafer-applied underfills are typically applied to a wafer, before the individual dies (or ICs) are singulated. Typically, solder balls are formed first. Then either a liquid underfill is dispensed and leveled (for example, by spinning) or a dry film underfill is laminated onto the bumped surface (i.e. the surface having solder balls) of the wafer. In the case of a dry film underfill material, partial removal of the underfill material is required to re-expose the solder balls. A protective coating may be applied to keep the material clean during singulation. Dies which already have solder balls and underfill material on it are then placed onto a carrier substrate and thermally treated to reflow the solder and cure the underfill material.

The present underfill materials also function as a die adhesive, i.e. they help in the attachment of a die or IC to a carrier substrate. A further advantage of the present invention is that underfills are provided that are re-moldable or re-workable, thus allowing ICs to be removed from IC assemblies. Such IC removal can be accomplished by heating the underfill material to a temperature sufficient to melt or at least partially de-polymerize the underfill material.

Such heating may optionally be performed in the presence of a solvent. A still further advantage is that the present underfill materials are self-healing. By "self-healing" it is meant that minor defects, such as cracks, in the underfill material are repaired by the material itself. Such self-healing can occur by heating, such as by utilizing the heat generated during normal use of the electronic device containing the IC assembly. In order to be self-healing, the underfill material needs an amount of flexibility within the polymer and monomers composing the polymer and an amount of reactivity that will allow the underfill material to partially de-polymerize and re-polymerize during use to repair certain defects, such as cracks. The present underfill compositions possess such flexibility.

A still further advantage is that the present compositions can be used to form device encapsulants such as glob-tops. In such devices, the present compositions are disposed over the entire device and cured. Such glob-tops are conventionally used in electronic packaging and optoelectronic packaging, including light emitting diodes and transponders.

The following examples are presented to illustrate further various aspects of the present invention, but are not intended to limit the scope of the invention in any aspect.

EXAMPLE 1

An underfill mixture of furan (0.3 mol) ("diene") and epoxybutene (0.3 mol) ("dienophile") are combined in a flask. The mixture is stirred and is then added to a dispensing syringe.

A die with solder balls is aligned to a printed wiring board substrate which has defined pads. The assembly is then sent through a "reflow oven" to melt the solder balls and connect the die to the substrate. After it is removed from the oven and cooled, the underfill mixture is dispensed from the syringe, and the material is pulled into the gap between the die and the substrate via capillary forces. The assembly is then placed into an oven, until the underfill material has cured.

EXAMPLE 2

An underfill composition is prepared by combining 2-vinyl-1,3-butadiene (0.41 mol) ("diene") and compound A (n=3) (0.40 mol) ("dienophile") in a flask. The mixture is then stirred for 15 minutes.

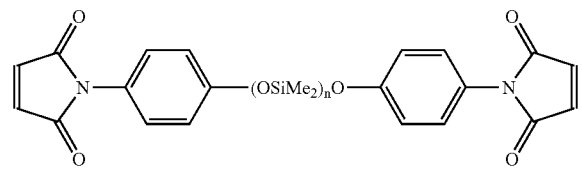

(A)

The underfill composition is then applied by spin coating to a wafer having solder balls attached to each of the communication pads of the non-singulated dies. The underfill is then cured by heating. A protective coating is next applied to keep the material clean during singulation of the dies. After singulation, the protective coating is removed and the singulated die is placed onto a 5×5 cm FR4 substrate to form an IC assembly and thermally treated to reflow the solder and finish curing the underfill.

EXAMPLE 3–16

The procedure of Example 1 is repeated except that the following dienes and dienophiles and optional solvents are used.

| Example | Diene | Dienophile | Solvent |
|---|---|---|---|
| 3 | Cyclooctadiene | N-Methylmaleimide | THF |
| 4 | Butadiene | Maleimide | |
| 5 | Isoprene | Norbornene | |
| 6 | Cyclopentadiene | 2,5-Dihydrofuran | THF |
| 7 | 2-Vinyl-1,3-butadiene | Styrene | |
| 8 | Isoprene | Acrylic acid | |
| 9 | (dicyclopentadienyl-CH$_2$) | Epoxybutene | THF |
| 10 | (dicyclopentadienyl-CH$_2$OSi(CH$_3$)$_2$OCH$_2$-) | Epoxybutene | |
| 11 | Furan | (bis-maleimide-N—CH$_2$—N) | |

-continued

| Example | Diene | Dienophile | Solvent |
|---|---|---|---|
| 12 | (dicyclopentadienyl-CH₂-) | bis-maleimide N-CH₂-N | THF |
| 13 | (cyclopentadienyl)-CH₂OSi(CH₃)₂OCH₂-(cyclopentadienyl) | bis-maleimide N-CH₂-N | DMSO |
| 14 | (dicyclopentadienyl-CH₂-) | allyl glycidyl ether | |
| 15 | (dicyclopentadienyl-CH₂-) | bis-maleimide with -(OSiMe₂)ₙO- linker, n = 3 | |
| 16 | 2-Vinyl-1,3-butadiene | tris-maleimide N[CH₂-N(maleimide)]₃ | |

EXAMPLES 17–30

The procedure of Example 2 is repeated except that the following dienes and dienophiles and optional solvents are used.

| Example | Diene | Dienophile | Solvent |
|---|---|---|---|
| 17 | Cyclooctadiene | N-Methylmaleimide | THF |
| 18 | Butadiene | Maleimide | |
| 19 | Isoprene | Norbornene | |
| 20 | Cyclopentadiene | 2,5-Dihydrofuran | THF |
| 21 | 2-Vinyl-1,3-butadiene | Styrene | |
| 22 | Isoprene | Acrylic acid | |
| 23 | (dicyclopentadienyl-CH₂-) | Epoxybutene | THF |
| 24 | (cyclopentadienyl)-CH₂OSi(CH₃)₂OCH₂-(cyclopentadienyl) | Epoxybutene | |

-continued

| Example | Diene | Dienophile | Solvent |
|---|---|---|---|
| 25 | Furan | 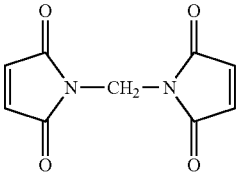 | |
| 26 | 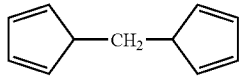 | 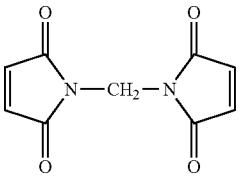 | THF |
| 27 | 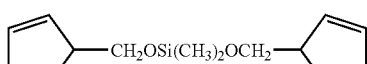 | 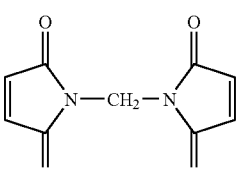 | DMSO |
| 28 | 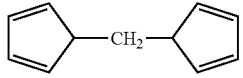 | 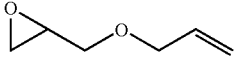 | |
| 29 | 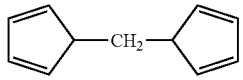 | 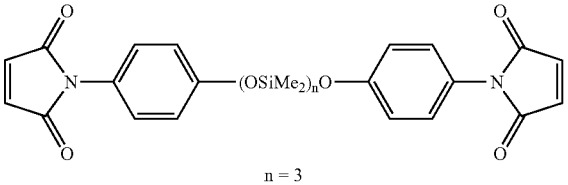<br>n = 3 | DMF |
| 30 | 2-Vinyl-1,3-butadiene | 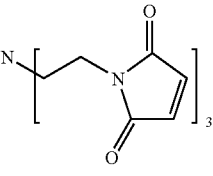 | |

EXAMPLE 31

A die with solder balls is aligned to a printed wiring board substrate which has defined pads. The assembly is then sent through a "reflow oven" to melt the solder balls and connect the die to the substrate. After it is removed from the oven and cooled, an underfill composition of a mixture of 1.93 g of octamethylcyclotetrasiloxane and 0.01 g of tris-(2-heptamethylcyclotetrasiloxane-ethyl)methylsilane and 0.6 g of a fumed silica filler with 5 μL of trifluoromethane sulfonic acid is quickly dispensed via syringe. The underfill composition is pulled into the gap between the die and the substrate via capillary forces. The underfill composition rapidly cures but retains a relatively-low viscosity inside.

EXAMPLE 32

The procedure of Example 31 is repeated except that the underfill composition is a mixture of 0.19 g of 1,3,5,7-tetra-(2-heptamethylcyclotetra-siloxane-yl-ethyl)-1,3,5,7-tetramethylcyclotetrasiloxane and 14.81 g of octamethylcyclotetrasiloxane with 1 μL trifluoromethanesulfonic acid.

EXAMPLE 33

The procedure of Example 31 is repeated except that the underfill composition is a mixture of 0.27 g of 1,1,3,3-tetra-(2-heptamethylcyclotetrasiloxane-yl-ethyl)-1,3-dimethyldisiloxane and 14.73 g of octamethylcyclotetrasiloxane with 1 μL trifluoromethanesulfonic acid.

EXAMPLE 34

The procedure of Example 31 is repeated except that the underfill composition is a mixture of 0.08 g of tris-(2-heptamethylcyclotetrasiloxane-yl-ethyl)methylsilane and 14.92 g of octamethylcyclotetrasiloxane with 2 μL trifluoromethanesulfonic acid.

EXAMPLE 35

The procedure of Example 31 is repeated except that the underfill composition is a mixture of 0.30 g of 1,3-di-{2-[tri-(2-heptamethylcyclotetra-siloxane-yl-ethyl)]-silyl-ethyl}-1, 1,3,3-tetramethyldisiloxane and 14.70 g of octamethylcyclotetrasiloxane with 2 µL trifluoromethanesulfonic acid.

EXAMPLE 36

A solder-masked 8-ply (epoxy-glass) printed circuit board is placed on a gel plate at 155° C. and allowed to heat up to temperature. The underfill composition of Example 2 is dispensed on the board and an IC is placed on top of the underfill composition and allowed to adhere to the board. The board is then removed from the gel plate and allowed to cool to room temperature. The IC will stay adhesively attached to the board as the underfill composition forms a crosslinked solid at room temperature. The board is next re-introduced back to the hot gel plate and allowed to heat for one minute. The IC is then removed from the board easily as the adhesive system reverts back to its uncrosslinked liquid state. The IC is then reattached back on the board at its original location by means of the adhesive film that is still present and the board is then removed from the gel plate and cooled to room temperature.

EXAMPLE 37

Two IC assemblies from Example 2 are dropped on the floor from a height of 1.3 meters, the mechanical shock results in a visible defect in the cured underfill material in each of the IC assemblies. A first IC assembly is reheated for at least 1 hour. After reheating, the underfill is examined and no visible defects are expected. The second IC assembly is attached to a test device and subjected to normal operating conditions for at least 12 hours. After use, the IC assembly is examined and no visible defects are expected.

What is claimed is:

1. A method of preparing an encapsulated integrated circuit assembly comprising the steps of: a) providing an integrated circuit assembly comprising an integrated circuit attached to a carrier substrate by a plurality of metallic connections, the metallic connections extending from the carrier substrate to the integrated circuit to form a gap between the carrier substrate and the integrated circuit; b) filling the gap with an underfill composition comprising a binder selected from the group consisting of a Diels-Alder reaction polymer and a polycyclosiloxane, wherein the Diels-Alder reaction polymer includes as polymerized units one or more dienophiles and one or more dienes, wherein at least one diene contains one or more hydrogens bonded to each of the olefinic carbons of the diene.

2. The method of claim 1 wherein the polycyclosiloxane comprises a compound of formula VII:

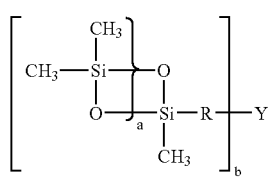

(VII)

wherein a=1–20; b=the valence of Y; R is O, $(C_1-C_{12})$alkylene, $(C_1-C_3)$alkyleneoxy, arylene, and aryleneoxy; and Y is H, OH, $(SiE_c)_d$ and

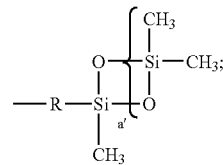

each E is independently R, H, O, OH, $(C_1-C_{12})$alkyl, $(C_2-C_{12})$alkenyl, aryl and $(C_1-C_{12})$alkoxy; c=0–3; d=1–100; and a'=1–20.

3. The method of claim 1 wherein at least one diene has the formula

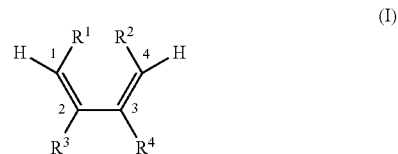

(I)

where $R^1$, $R^2$, $R^3$ and $R^4$ are independently selected from hydrogen, alkyl, alkenyl, aryl, heteroatoms, and substituted heteroatoms; and $R^1$ and $R^2$ or $R^3$ and $R^4$ may be taken together to form a cyclodiene.

4. An electronic device comprising an encapsulated integrated circuit assembly comprising an integrated circuit assembly comprising an integrated circuit attached to a carrier substrate by a plurality of metallic connections, the metallic connections extending from the carrier substrate to the integrated circuit to form a gap between the carrier substrate and the integrated circuit; and an underfill material in the gap, wherein the underfill material is composed of a binder selected from the group consisting of a Diels-Alder reaction polymer and a polycyclosiloxane, wherein the Diels-Alder reaction polymer includes as polymerized units one or more dienophiles and one or more dienes, wherein at least one diene contains one or more hydrogens bonded to each of the olefinic carbons of the diene.

5. The electronic device of claim 4 wherein the polycyclosiloxane comprises a compound of formula VII:

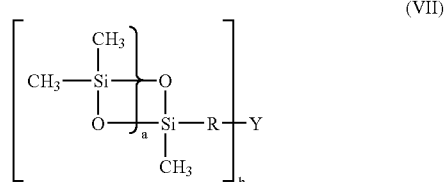

(VII)

wherein a=1–20; b=the valence of Y; R is O, $(C_1-C_{12})$alkylene, $(C_1-C_3)$alkyleneoxy, arylene, and aryleneoxy; and Y is H, OH, $(SiE_c)_d$ and

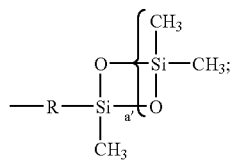

each E is independently R, H, O, OH, $(C_1-C_{12})$alkyl, $(C_2-C_{12})$alkenyl, aryl and $(C_1-C_{12})$alkoxy; $c=0-3$; $d=1-100$; and $a'=1-20$.

6. The electronic device of claim 4 wherein at least one diene has the formula

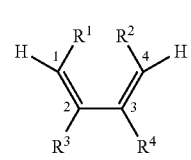
(I)

where $R^1$, $R^2$, $R^3$ and $R^4$ are independently selected from hydrogen, alkyl, alkenyl, aryl, heteroatoms, and substituted heteroatoms; and $R^1$ and $R^2$ or $R^3$ and $R^4$ may be taken together to form a cyclodiene.

* * * * *